(12) United States Patent
Araki et al.

(10) Patent No.: US 9,806,671 B2
(45) Date of Patent: Oct. 31, 2017

(54) SOLAR CELL MODULE

(71) Applicant: SUMITOMO ELECTRIC INDUSTRIES, LTD., Osaka (JP)

(72) Inventors: Yusuke Araki, Mie (JP); Takahiro Asao, Mie (JP); Yoshiya Abiko, Osaka (JP); Takashi Iwasaki, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/291,648

(22) Filed: May 30, 2014

(65) Prior Publication Data

US 2014/0352766 A1 Dec. 4, 2014

(30) Foreign Application Priority Data

Jun. 4, 2013 (JP) ................................. 2013-117756

(51) Int. Cl.
*H02S 40/34* (2014.01)
*H01L 31/02* (2006.01)

(52) U.S. Cl.
CPC ........ *H02S 40/34* (2014.12); *H01L 31/02013* (2013.01); *Y02E 10/52* (2013.01)

(58) Field of Classification Search
CPC ....... H02S 40/34; H02S 40/30; H05K 5/0217; H05K 5/0247; H05K 5/0204; H05K 5/02;
(Continued)

(56) References Cited

U.S. PATENT DOCUMENTS 6,166,321 A * 12/2000 Sasaoka et al. ............... 136/251
6,462,265 B1 * 10/2002 Sasaoka ................ H01L 31/048
136/251
(Continued)

FOREIGN PATENT DOCUMENTS

CN 1253382 5/2000
CN 102237423 11/2011
(Continued)

OTHER PUBLICATIONS

English Translation of JP 2000-357812, accessed 2017 via Japanese Patent Office.*
(Continued)

*Primary Examiner* — Devina Pillay
*Assistant Examiner* — Daniel Malley, Jr.
(74) *Attorney, Agent, or Firm* — Greenblum & Bernstein, P.L.C.

(57) ABSTRACT

According to one embodiment, a solar cell module includes: a casing including a wall; a box made of a resin and attached to the casing, the box including a terminal accommodating part; a cable configured to connect an external part, an end part of the cable introduced to the box; and a terminal fitting, accommodated in the terminal accommodating part, the terminal fitting connected to the cable and an output conductor, wherein: the wall is formed with a first opening for attaching the box from an outer surface side; the terminal accommodating part is formed with a second opening at a position opposed to the wall; and the second opening faces an inner part of the casing through the first opening when the box is attached to the casing.

6 Claims, 9 Drawing Sheets

(58) Field of Classification Search
CPC ......... H01L 31/02002; H01L 31/02008; H01L 31/02021
See application file for complete search history.

(56) References Cited

U.S. PATENT DOCUMENTS

| | | | | |
|---|---|---|---|---|
| 7,655,859 | B2* | 2/2010 | Naβ | H01R 13/5205 136/243 |
| 9,101,082 | B1* | 8/2015 | Dorenkamp | H05K 7/2089 |
| 2001/0001424 | A1* | 5/2001 | Sasaoka | 174/50 |
| 2005/0000562 | A1 | 1/2005 | Kataoka et al. | |
| 2005/0197001 | A1 | 9/2005 | Higashikozono et al. | |
| 2011/0186113 | A1* | 8/2011 | Nishi | H01L 31/02013 136/251 |
| 2012/0127770 | A1 | 5/2012 | Kim | |
| 2012/0208397 | A1* | 8/2012 | Schwarze | H01R 29/00 439/534 |
| 2013/0090007 | A1* | 4/2013 | Umemoto | H01R 33/965 439/536 |
| 2013/0153004 | A1* | 6/2013 | Knapp | H02S 40/34 136/251 |

FOREIGN PATENT DOCUMENTS

| | | | |
|---|---|---|---|
| CN | 102405532 | | 4/2012 |
| CN | 202678363 | | 1/2013 |
| DE | 21 2011 100 086 | | 2/2013 |
| JP | 2000-68547 | | 3/2000 |
| JP | 2000-357812 | | 12/2000 |
| JP | 2000357812 A | * | 12/2000 |
| JP | 2001-24206 | | 1/2001 |
| JP | 2006-73798 | | 3/2006 |
| JP | 2011-49189 | | 3/2011 |
| JP | 2011-49219 | | 3/2011 |
| JP | 2013-80760 | | 5/2013 |
| KR | 10-0735101 | | 6/2007 |
| WO | 2010/122856 | | 10/2010 |

OTHER PUBLICATIONS

Official Action, with English-language translation thereof, for CN Appl. No. 201410244848.9 having an issuance dated Dec. 21, 2015.
Official Action, with English-language translation thereof, for TW Appl. No. 103119232 having an issuance dated Dec. 28, 2015.
Official Action, along with English-language translation thereof, in JP Appl. No. 2013-117756 dated Nov. 11, 2016.

* cited by examiner

SOLAR CELL MODULE

BACKGROUND

1. Field of the Invention

The present invention relates to a solar cell module.

2. Description of the Related Art

Below-described JP-A-2006-73978 discloses a structure wherein a terminal box which transmits an electric power of a solar cell to an external part is attached to a back surface of a casing of a solar cell module. In the box, a terminal block connected to an output conductor of the solar cell module and an end portion of a cable connected to the terminal block, to transmit the electric power to the external part, are accommodated. After the output conductor of the solar cell module is connected to the terminal block, the box is charged with a sealing material.

As described above, the usual terminal box is attached such that the terminal box is opened in a direction of the back surface of the casing. Accordingly, after the output conductor of the solar cell module provided in the casing is guided to an inner part of the terminal box in the back side of the casing through openings provided in the back surface of the casing and an opposed surface of the terminal box, the output conductor needs to be connected to the terminal block. Further, the charging operation of the sealing material needs to be carried when an entire part of the casing is directed to the back side, which causes problems.

Accordingly, there is a room for improvement in a usual attaching operation of the terminal box.

The present invention is accomplished by considering the above-described circumstances and it is an object of the present invention to improve a working process of an attaching operation of a terminal box.

According to a first aspect of the invention, there is provided a solar cell module including: a casing including a wall and a box of a resin that is attached to the casing. The box includes a terminal accommodating part, a cable configured to connect to an external part, an end part of the cable introduced to the box; and a terminal fitting, accommodated in the terminal accommodating part, the terminal fitting connected to the cable and an output conductor. The wall is provided with a first opening for attaching the box from an outer surface side; the terminal accommodating part is provided with a second opening at a position opposite to the wall; and the second opening faces an inner part of the casing through the first opening when the box is attached to the casing According to the present invention, when the box is attached to the casing, the opening of the terminal accommodating part of the box faces the inner part of the casing through the attaching opening part. Accordingly, when a potting or sealing material is injected into the terminal accommodating part, an injection operation and a connecting operation of the output conductor of the solar cell module to the terminal fitting can be carried out from the same direction. Namely, since both operations can be carried out from an inside of the casing, an ease and efficiency of performing the assembly operation is excellent.

BRIEF DESCRIPTION OF THE DRAWINGS

The present invention will become more fully understood from the detailed description given hereinbelow and the accompanying drawing which is given by way of illustration only, and thus is not limitative of the present invention and wherein.

DETAILED DESCRIPTION OF THE INVENTION

Figure 1:
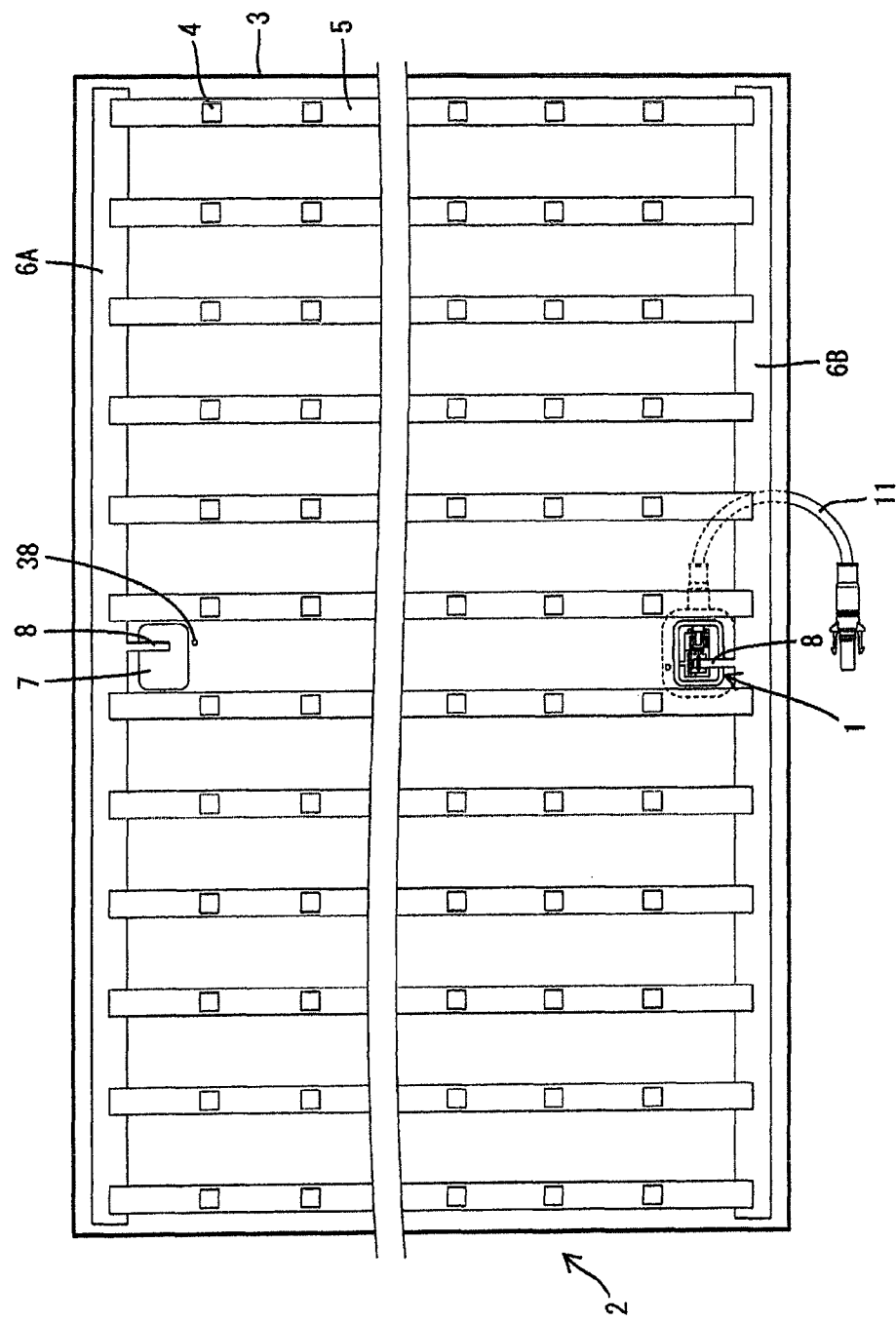
FIG. 1 is a plan view of a solar cell module.

A preferred exemplary embodiment of the present invention will be described below.

A solar cell module of the present invention preferably has a structure such that the terminal accommodating part in the box has a cylindrical shape which can be fitted to the attaching opening part and an engaging part, can be engaged with an opening edge of the attaching opening part, is provided in an outer peripheral surface of the terminal accommodating part.

According to such a structure, since the box fits the terminal accommodating part to the attaching opening part of the casing so that the engaging part, provided in the terminal accommodating part is engaged with the opening edge of the attaching opening part, an attaching operation of the box can be simply carried out.

Further, in a rear part of the engaging part of the terminal accommodating part in a fitting direction, a flange edge opposed to the periphery of the attaching opening part is formed to protrude along a circumferential direction. To the flange edge, an adhesive agent may be applied.

According to such a structure, the box is temporarily held by an engagement of the engaging part until the adhesive agent applied to the flange edge hardens, so that time and labor for holding the box can be saved. Further, after the adhesive agent is hardened, since an adhesive strength of the adhesive agent is added to the engagement strength of the engaging part, an attached state of the box is strengthened.

Now, an exemplary embodiment, which embodies the solar cell module of the present invention, will be described below by referring to the drawings.

<Exemplary Embodiment>

As shown in FIG. 1, a terminal box 1 of the present exemplary embodiment is attached to a back surface side of a casing 3 of a solar cell module 2. The solar cell module 2 of the present exemplary embodiment is supported by a frame not shown in the drawing. This frame is, so-called light converging and tracking type power generation system in which the frame can follow a movement of the sun.

The solar cell module 2 is provided with casing 3 formed of a thin plate metal material. The casing 3 is formed in a square box shape that opens upward and opens in an upper surface side. The opening of the upper surface of the casing 3 is closed by a light converging plate not shown in the drawing. The light converging plate includes a plurality of Fresnel lenses on which solar light is converged.

As shown in FIG. 1, on a bottom plate of the casing 3, a plurality of solar cells 4 are arranged. The solar cells 4 are respectively lined and arranged at positions where the solar lights are converged by the light converging lenses. Further, electrodes of the solar cells 4 are respectively connected together by a plurality of electrically conductive paths 5 which are aligned to extend in the same direction. Both ends of the electrically conductive paths 5 are respectively connected together by electrode plates 6A and 6B which extend in directions intersecting the electrically conductive paths 5 at right angles.

As shown in FIG. 1, on the bottom plate of the casing 3, centrally of the directions in which the electrically conductive paths 5 are respectively arranged and which are nearer to both the electrode plates 6A and 6B, a pair of attaching opening parts 7 for attaching the terminal boxes 1 are provided and formed so as to pass through the back surface side of the casing 3. More specifically, both the attaching opening parts 7 are opened at positions sandwiched between the adjacent electrically conductive paths 5. Further, as shown in FIG. 1, from both the electrode plates 6A and 6B, output conductors 8 are extended integrally so that end sides thereof protrude towards the attaching opening parts 7.

Figure 8:
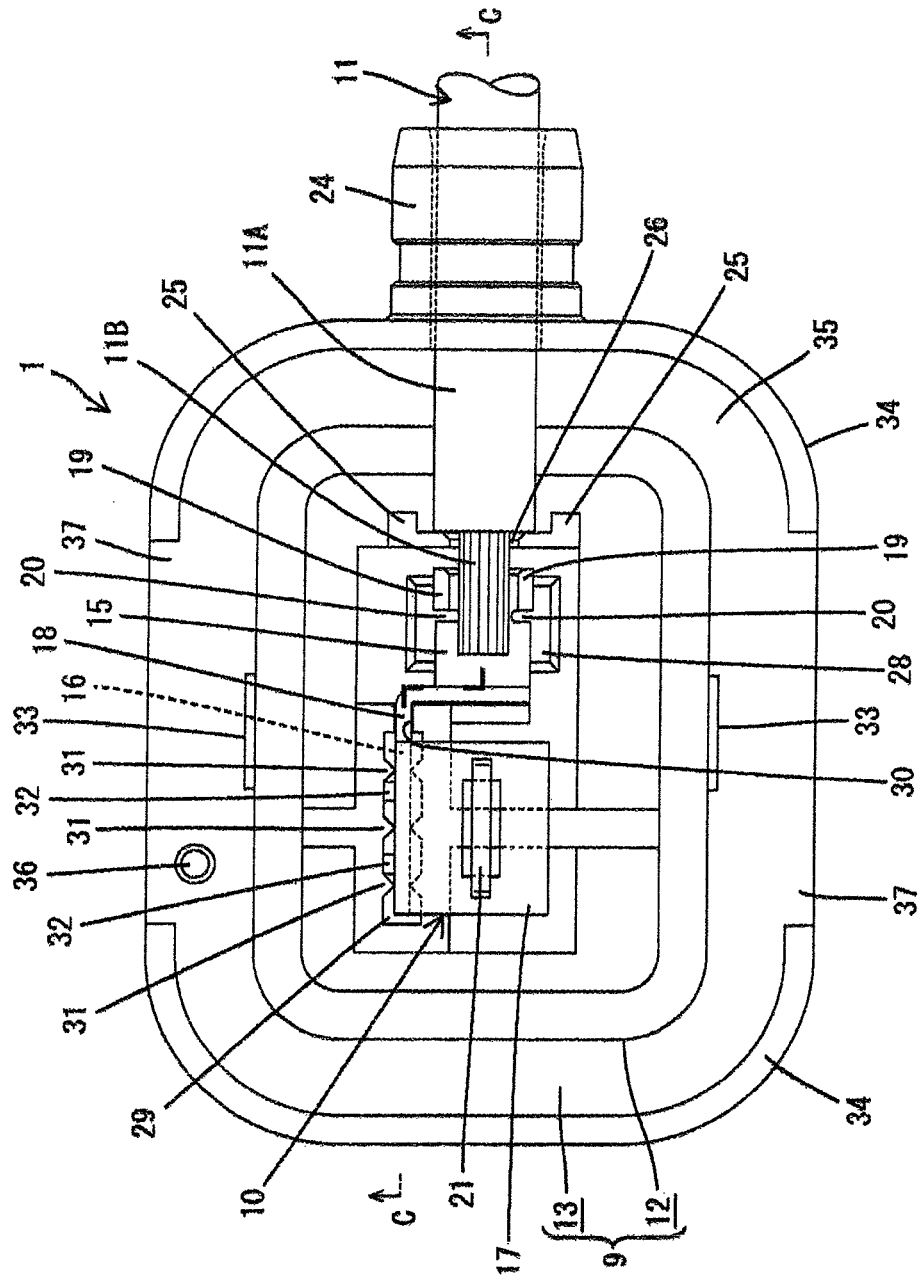
FIG. 8 is a plan view showing the terminal box to which the terminal block is attached.

One of the terminal boxes 1 serves as a positive side terminal box 1 connected to the electrode plate 6A as an anode side. The other of the terminal boxes serves as a negative side terminal box 1 connected to the electrode plate 6B as a cathode side. Each of the terminal boxes 1 includes, as shown in FIG. 8, a box 9, a terminal fitting 10 accommodated in the box 9 and a cable 11 having an end part accommodated in the box 9 and extending from the box 9.

The box 9 is formed of a synthetic resin so as to be open to the upper surface side (a side opposed to an outer surface of the bottom plate of the casing 3). The box 9 is formed integrally with a terminal accommodating part 12 of a rectangular tubular shape which accommodates the terminal fitting 10 and the end part of the cable 11 and a flange edge 13 formed to protrude along an outer wall surface of the terminal accommodating part 12.

Figure 4:
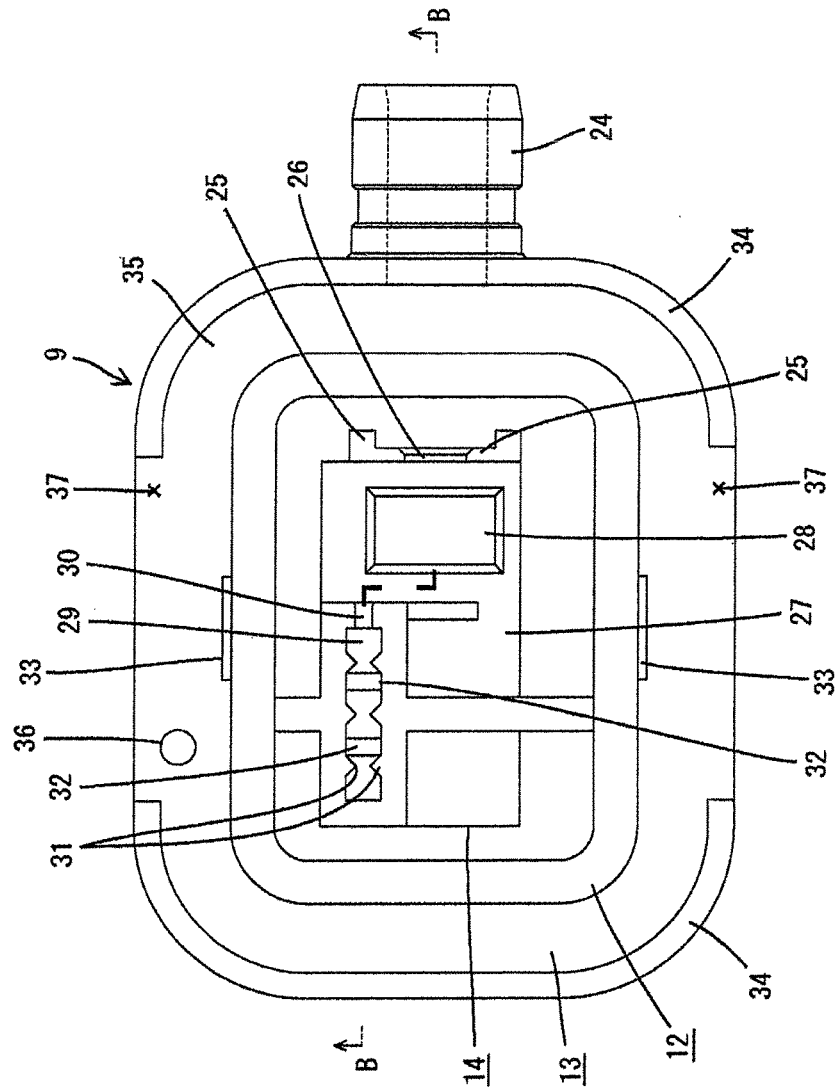
FIG. 4 is a plan view of a terminal box single body.

As shown in FIG. 4, on a bottom surface in the terminal accommodating part 12, a terminal base 14 is integrally provided so as to protrude therefrom. The terminal fitting 10 attached to the terminal base 14 will described below (see FIG. 6 and FIG. 7).

The terminal fitting 10 is integrally formed with en electrically conductive metal plate. The terminal fitting 10 includes a cable connecting part 15 for connection to the cable 11, an attaching part 16 for attachment to the terminal base 14 and a conductor connecting part 17 for a connection to the output conductor 8. The attaching part 16 is formed in the shape of a rectangular plate and is inserted into the terminal base 14 in a longitudinal direction (a direction along a plate surface). The attaching part 16 is continuously connected to the cable connecting part 15 through a connecting piece 18. The connecting piece 18 protrudes toward the cable 11 side from a side edge of the attaching part 16, then, is bent substantially at right angles so as to intersect, at right angle, an axis of the cable 11, and further, is bent, substantially at a right angle, from a lower edge thereof toward the cable 11 side and connected to the cable connecting part 15.

Figure 6:
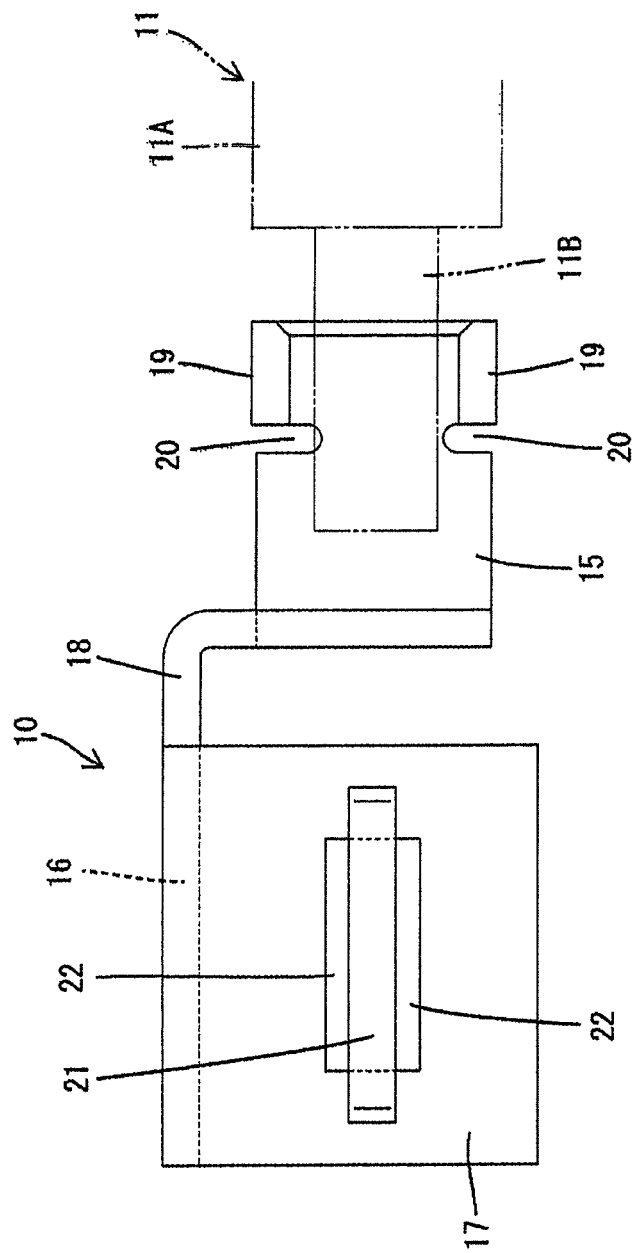
FIG. 6 is a plan view of a terminal block.

One pair of upright pieces 19 are formed to be opposed to each other and stand upright from both side edges of the cable connecting part 15. A core wire 11B exposed at an end part of the cable 11 is guided between both the upright pieces 19 and connected between them by soldering. In the present exemplary embodiment, as shown in FIG. 6, a pair of cut-out grooves 20 are respectively formed along a width direction at positions adjacent to both the upright pieces 19 in both side edges of the cable connecting part 15. Both the cut-out grooves 20 are provided so as to easily allow both the upright pieces 19 to stand up at the time of a pressing operation.

Figure 7:
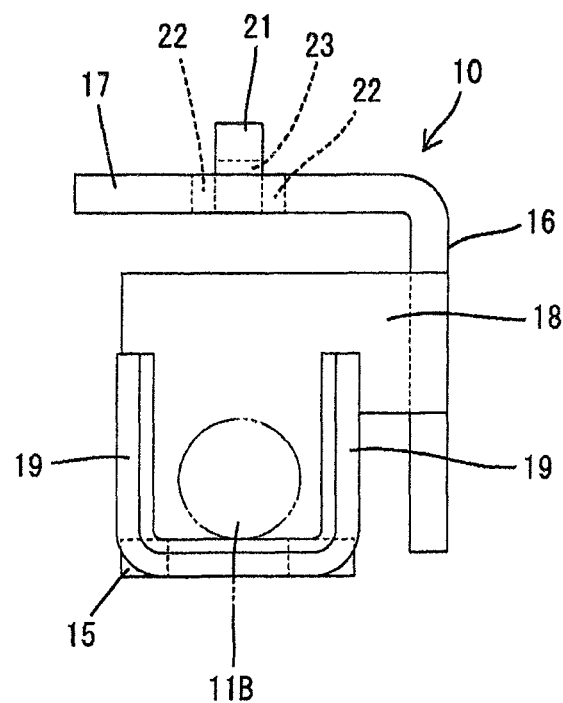
FIG. 7 is a side view of the terminal block.

The conductor connecting part 17 is bent substantially at right angles from an upper edge of the attaching part 16 to have a substantially horizontal position. In a central part of the conductor connecting part 17, an insert piece 21 for a connection to the output conductor 8 is formed. The insert piece 21 is formed in an inboard shape which extends in a direction intersecting, substantially at a right angle, an extending direction of the output conductor 8. Namely, the insert piece 21 is formed such that a part between a pair of slits 22 cut in the central part of the conductor connecting part 17, stick out and extend upward from a lower surface side. Thus, as shown in FIG. 7, in a side view of the terminal fitting 10, an insert hole 23, into which the output conductor 8 can be inserted, is formed between an upper surface of the conductor connecting part 17 and the insert piece 21.

Figure 5:
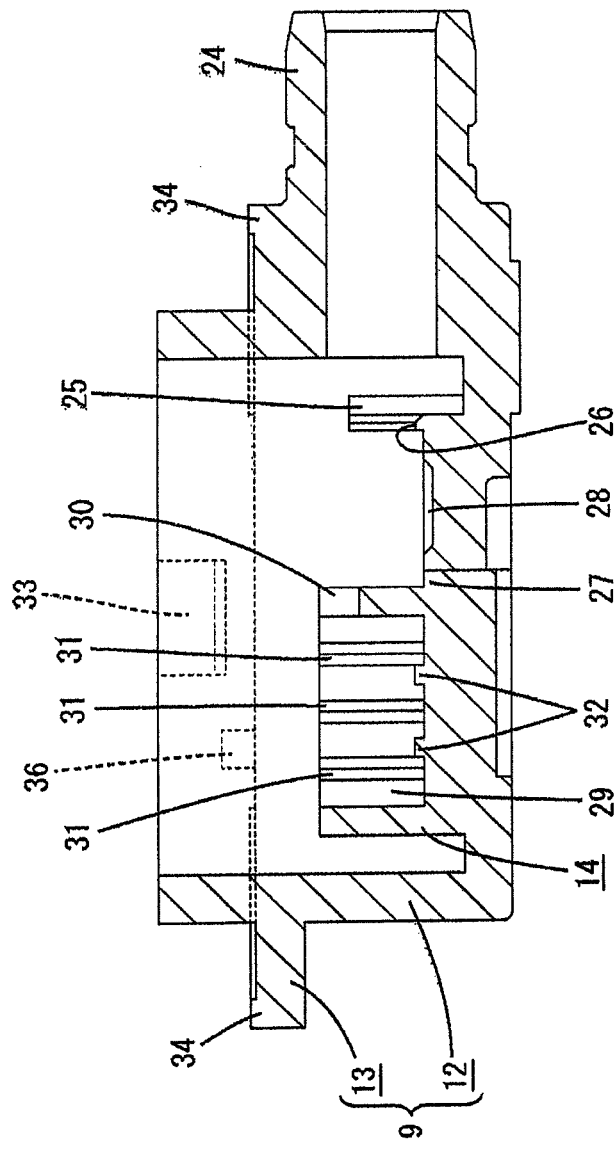
FIG. 5 is a sectional view taken along a line B-B of FIG. 4.

As shown in FIG. 4 and FIG. 5, in an outer side surface of the terminal accommodating part 12, an insert pipe part 24 is integrally formed to protrude therefrom. The insert pipe part 24 is formed to have a hollow configuration through which an inner part and an outer part of the terminal accommodating part 12 communicate with each other so that the end part of the cable 11 may be introduced into the terminal accommodating part 12. In the terminal accommodating part 12, at a position opposite to a part in which the insert pipe part 24 extends into the terminal accommodating part 12, an upright stopper wall 25 is provided. When the cable 11 is inserted into the insert pipe part 24, a front end part of a coating 11A of the cable 11 is allowed to butt against the stopper wall 25 to regulate an insert depth of the cable 11 into the terminal accommodating part 12. In a center of the stopper wall 25, an open through groove 26 is provided which allows the core wire 11B exposed in the end part of the cable 11 to pass through.

As shown in FIG. 4 and FIG. 5, in the central part on the bottom surface of the terminal accommodating part 12, a base part 27 is formed which is higher, by one step, than the bottom surface and forms a base part of the terminal base 14. The base part 27 is formed in a substantially rectangular shape in plan view and a protruding height from the bottom surface is set to be lower than that of the stopper wall 25. In a forward part, in an inserting direction of the cable 11, of the stopper wall 25 on an upper surface of the base part 27, a recessed substantially shaped part 28 is formed and is recessed.

Figure 9:
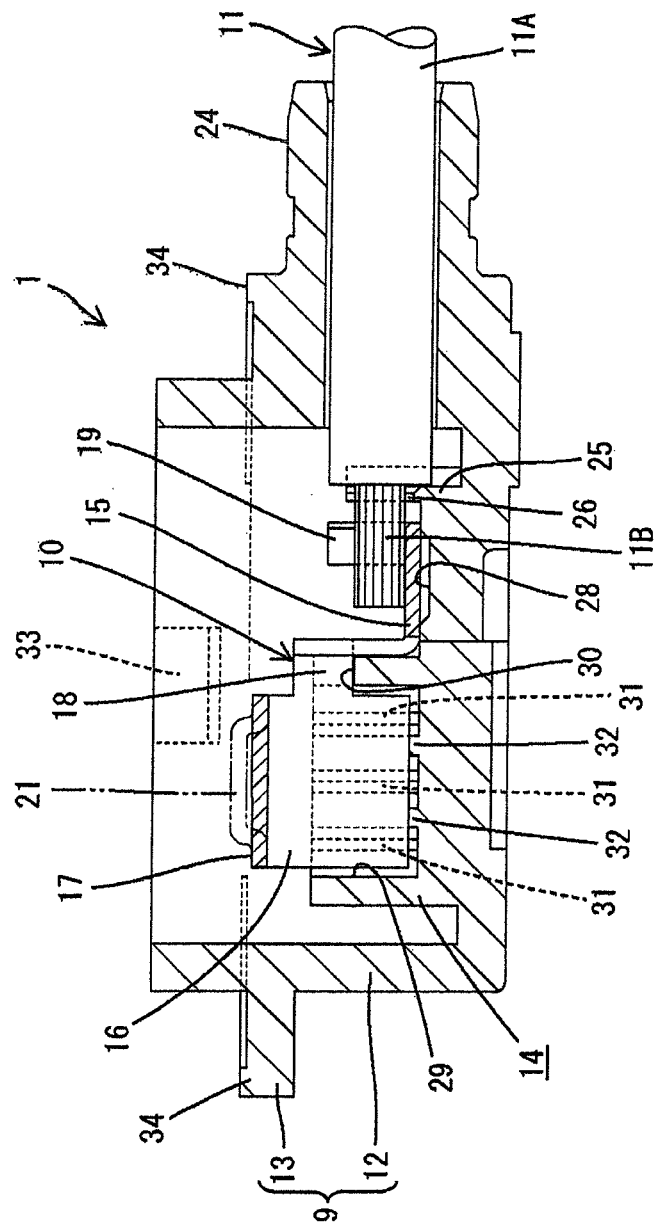
FIG. 9 is a sectional view taken along a line C-C of FIG. 8.

As shown in Fig. 8 and FIG. 9, when the terminal fitting 10 is attached to the terminal accommodating part 12, an area including a part of the cable connecting part 15, in which the cut-out grooves 20 are formed, traverses above the recessed part 28. Thus, the cable connecting part 15 is supported on the base part 27 at a location where the recessed part 28 is sandwiched between them (i.e., between 15 and 27). Since the recessed part 28 is a part to which heat is most easily transmitted during a soldering operation, a space is ensured to prevent a resin from being melted.

As shown in FIG. 4, the terminal base 14 protrudes in one corner part of the upper surface of the base part 27. The terminal base 14 is formed in the shape of a parallelepiped with a major dimension extending in a direction intersecting at a right angle with the extending direction of the output conductor 8. Further, on an upper surface of the terminal base 14, an insert groove 29, to which the attaching part 16 of the terminal fitting 10 is inserted, provided in the form of a slit. The insert groove 29 is open along an inserting direction of the terminal fitting 10. In an end part of the insert groove 29 at the cable 11 side, a release groove 29 is cut out and communicates with the insert groove 30 so that the connecting piece 18 may be released to be guided outside the terminal base 14 when the terminal fitting 10 is attached to the terminal base 14.

As shown in FIG. 4, at side surfaces opposite to each other along both long sides of the insert groove 29, three pairs of ribs 31, which are respectively opposed to each other protrude and extend along the inserting direction of the terminal fitting 10. The ribs 31 are respectively formed in the shapes of triangles in plan view and have sharp ends. Further, spaces between the paired ribs 31 are made smaller than a dimension of thickness of the attaching part 16 of the terminal fitting 10. Accordingly, when the terminal fitting 10 is attached to the terminal base 14, the attaching part 16 collapses (or bends) the ends of the ribs 31 respectively, and the attaching part is pressed in to the insert groove 29.

In the present exemplary embodiment, as shown in FIG. 4 and FIG. 5, on a bottom surface of the insert groove 29, two support protrusions 32 are formed to protrude at prescribed intervals. Both the support protrusions 32 are provided in a direction crossing both the long side parts of the insert groove 29. Both the support protrusions 32 serve to support the attaching part 16 of the terminal fitting 10 such that the attaching part is allowed to float (i.e. be spaced) from the bottom surface of the insert groove 29. Accordingly, even if shavings are formed when the attaching part 16 of the terminal fitting 10 is pressed in to the insert groove 29, the shavings drop into the spaces defined by the support protrusions 32. Thus, the attaching part 16 can be assuredly inserted into the insert groove 29 to such a depth as to allow a lower end to abut on both the support protrusions 32.

Figure 3:
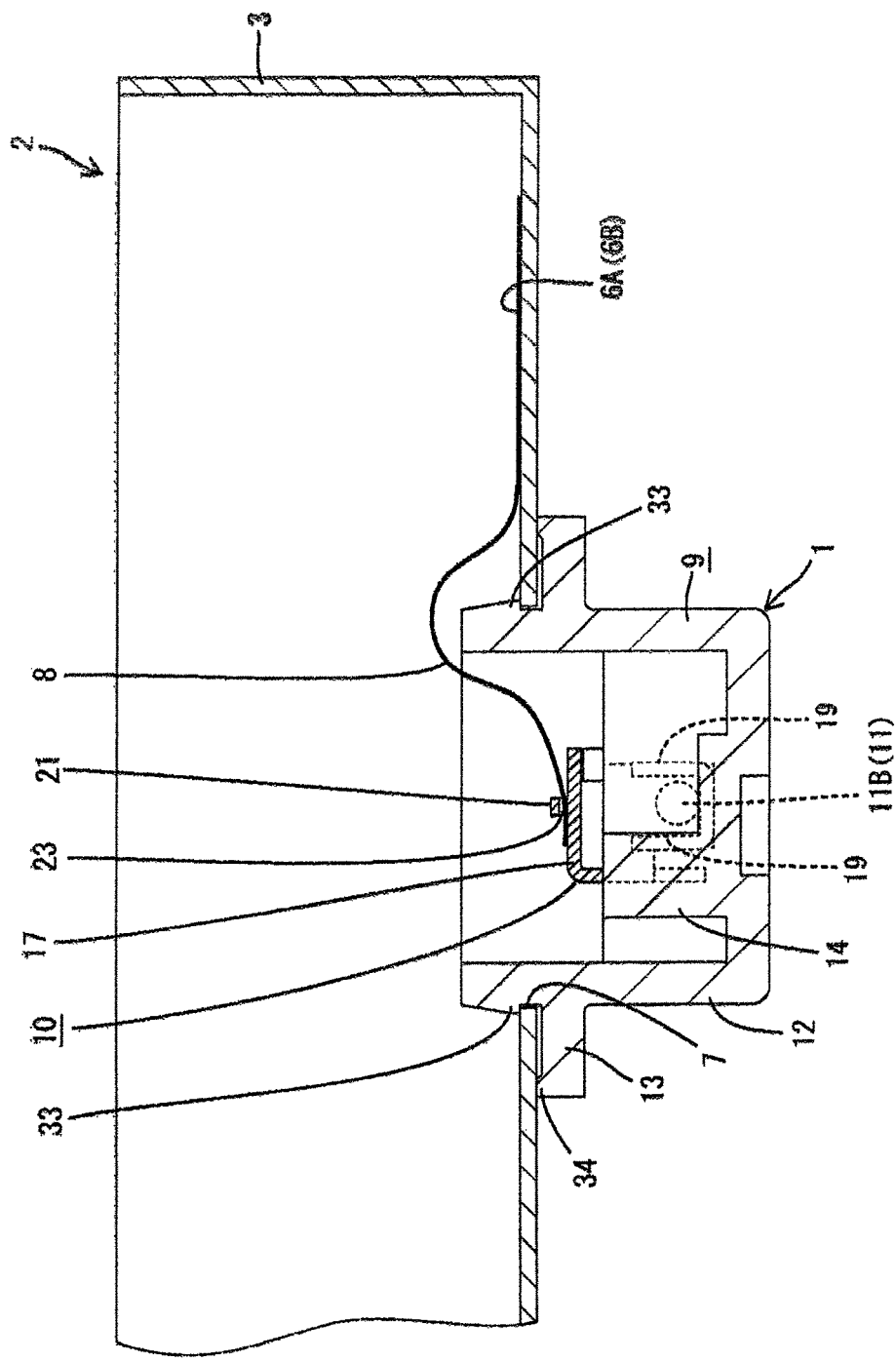
FIG. 3 is a sectional view taken along a line A-A of FIG. 2.

The upper surface opening side of the terminal accommodating part 12 is formed so as to be fitted to the attaching opening part 7 of the casing 3 in the solar cell module 2 from an outer surface side of the casing 3. Further, in central parts in a width direction on the outer surface sides of both long sides of the terminal accommodating part 12, a pair of engaging pawls 33 (engaging parts) are arranged. As shown in FIG. 3, both the engaging pawls 33 are formed and protrude so as to provide increased thickness along a fitting or insertion direction from an opening edge of the terminal accommodating part 12. When the terminal accommodating part 12 of the box 9 is fitted to the attaching opening part 7 of the casing 3, both the engaging pawls 33 slightly and flexibly deform the periphery of the attaching opening part 7 and pass through the attaching opening part 7. When the engaging pawls 33 enter the casing 3, since the engaging pawls 33 are engaged with an opening edge of the attaching opening part 7, the terminal box 1 can be held by the casing 3.

The flange edge 13 which forms the box 9 together with the terminal accommodating part 12 is formed and protrudes outward along an entire circumference with a height which slightly decreases as it extends backward (i.e. away) from the opening edge of the terminal accommodating part 12. The flange edge 13 can be opposed to an outer surface at the periphery of the attaching opening part 7 of the casing 3 when the terminal accommodating part 12 is fitted to the attaching opening part 7 of the casing 3. As shown in FIG. 4 and FIG. 5, in a surface of the flange edge 13 opposed to the casing 3, an annular protruding edge 34 is formed along an outer peripheral edge except in a part of a range. On an upper surface of the flange edge 13, an adhesive surface 35 is formed to which an adhesive agent is applied between the annular protruding edge 34 and an outer peripheral surface of the terminal accommodating part 12. A protruding height of the annular protruding edge 34 is quite low, as small as a thickness of the adhesive agent that is applied. In central parts of both sides (both long sides) of the annular protruding edge 34 which intersect at right angles with the extending direction of the output conductor 8, the annular protruding edge 34 is cut out over predetermined ranges to form outlet ports 37 of the adhesive agent. Thus, surplus adhesive agent is forced outside the annular protruding edge 34.

As shown in FIG. 4, a positioning pin 36 is formed and protrudes inside one outlet port 37 in the adhesive surface 35 of the flange edge 13 and can be inserted into a positioning hole 38 provided at a position adjacent to the attaching opening part 7 in the casing 3.

As a result the positive side and the negative side of the terminal box 1 are prevented from being erroneously attached to the casing 3.

Now, an assembling process of the terminal box 1 of the present exemplary embodiment and an attaching process of the terminal box 1 to the casing 3 of the solar cell module 2 will be described below.

Initially, the assembling process of the terminal box 1 will be described. The attaching part 16 of the terminal fitting 10 is fitted to the insert groove 29 of the terminal base 14 and the connecting piece 18 is fitted to the release groove 30 to push in the attaching part 16. Then, the attaching part 16 collapses or deforms the end edges of the ribs 31 and is pressed into the insert groove 29. Then, when the lower edge of the attaching part 16 is butted against the support protrusions 32, the terminal fitting 10 is brought into a normal attached state. In such a way, when a press-in type structure is used such that the ribs 31 are respectively allowed to collapse or deform during insertion of the attaching part 16, the terminal fitting 10 can be assuredly and securely held by use of the terminal base 14 by a simple structure.

Further, when the attaching part 16 collapses the ends of the ribs 31, shavings probably may be formed. However, the shavings can drop into the spaces provided by the support protrusions 32. If the support protrusions 32 are not provided and the lower edge of the attaching part 16 abuts on the bottom surface of the insert groove 29, a situation arises that the shavings bite a part (or lodge in the space) between the attaching part 16 and the bottom surface of the insert groove 29 so that it is impossible to insert the attaching part 16 to a normal depth in the insert groove 29. Due to the present exemplary embodiment, such a situation can be avoided.

Then, the cable 11 having the core wire 11B exposed in the end part is inserted from the connecting pipe part of the box 9 and an end face the coating 11A of the cable 11 is allowed to butt against the stopper wall 25. Thus the core wire 11B of the cable 11 is guided between both the upright pieces 19 of the terminal fitting 10 through the through groove 26. In this position, molten solder is poured between both the upright pieces 19 to solder the core wire 11B to the cable connecting part 15.

Figure 2:
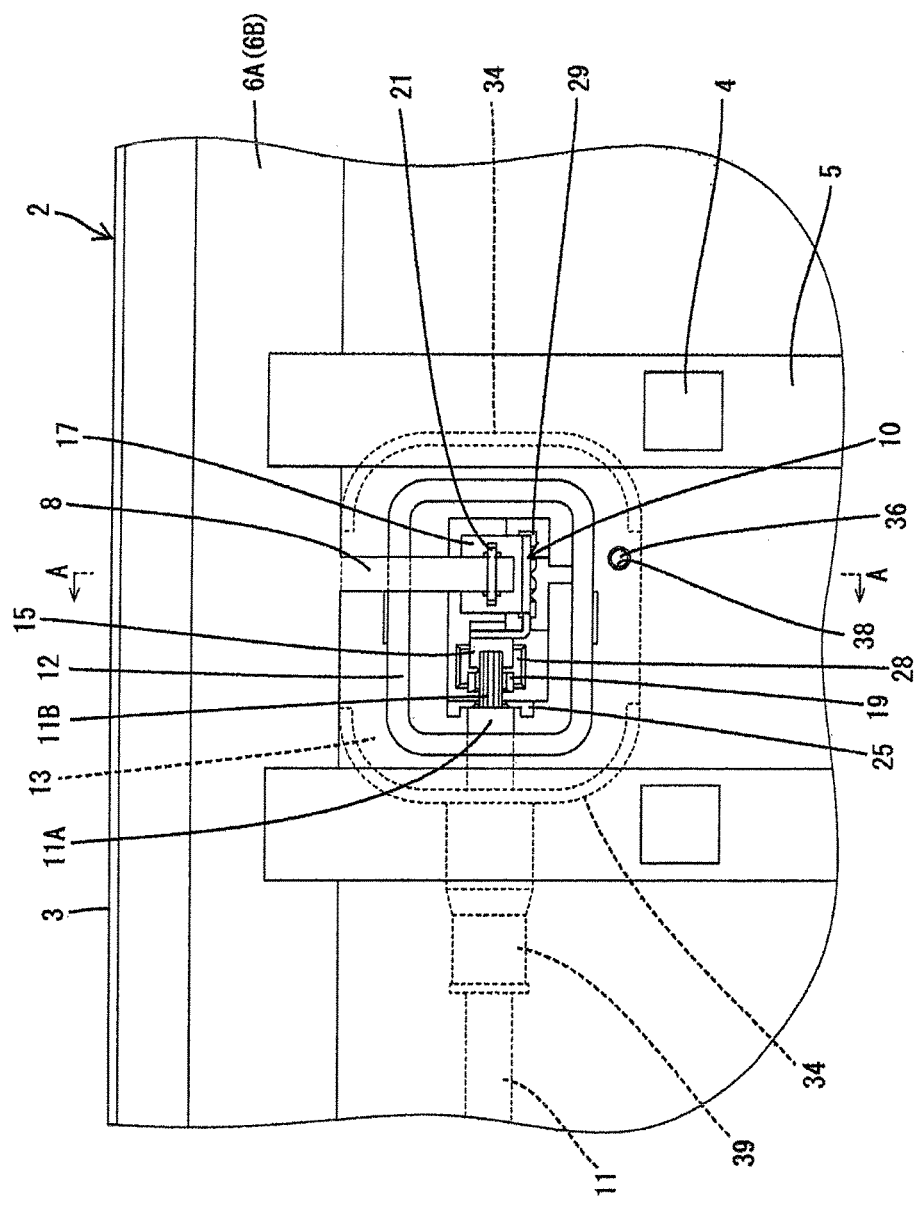
FIG. 2 is a plan view showing an attaching part of a terminal box which is enlarged.

To the coating 11A of the cable 11, a seal tube 39 is previously inserted. As shown in FIG. 2, when the cable 11 is connected to the box 9, the seal tube 39 abuts on an outer surface of the box 9 to coat the insert pipe part 24 and the coating 11A of the cable 11 therewith. Thus, a sealing property is ensured.

When the assembling of the terminal box 1 is completed as described above, the attaching of the terminal box 1 to the casing 3 is carried out. Initially, in the flange edge 13 of the box 9, the adhesive agent is applied to substantially the entire surface of an inside area of the annular protruding edge 34 and an upper surface of the annular protruding edge 34. Then, the terminal box 1 is fitted to the attaching opening part 7 of the casing 3 from the opening surface side of the terminal accommodating part 12. At this time, the positioning pin 36 is inserted into the positioning hole 38 of the casing 3 side. When one attempts to attache the terminal box 1 to the casing in a wrong direction, the positioning pin 36 does not correctly face the positioning hole 38, so that the positioning pin 36 interferes with the outer surface of the casing 3. Accordingly, an operator can recognize, from the above-described phenomenon, that the attached position of the terminal box 1 is not correct.

When the terminal accommodating part 12 passes through the attaching opening part 7, as described above, both the engaging pawls 33 forcibly and flexibly deform an opening edge of the attaching opening part 7 in an expanding and opening direction and enter the casing 3. When both the engaging pawls 33 pass through the attaching opening part 7, the opening edge of the attaching opening part 7 is reset (i.e. return to their undeformed state) to be engaged with both the engaging pawls 33. At this time, in the terminal box 1, the parts to which the adhesive agent is applied, are pressed to the outer surface in the periphery of the attaching opening part 7 in the casing 3. In such a way, since the terminal box 1 is held by the engaging pawls 33 until the adhesive agent is dried and hardened, the terminal box 1 does not need to be held during that time. Thus, the person performing the attaching, can immediately move on to next task. Further, after the adhesive agent is hardened, since an engagement strength of the engaging pawls 33 is added to an adhesive strength of the adhesive agent in the terminal box 1, a holding force of the terminal box 1 is strengthened.

Subsequently, an operation for connecting the output conductor 8 of the solar cell module 2 to the terminal fitting 10 is carried out. In this case, as shown in FIG. 3, an end part of the output conductor 8 is guided to the terminal accommodating part 12 and inserted into the insert hole 23 of the conductor connecting part 17 of the terminal fitting 10 (FIG. 7). In this state, the output conductor 8 and the conductor connecting part 17 of the terminal fitting 10 are soldered.

After that, a potting material (a sealing material) is injected to the terminal accommodating part 12 from the opening side of the terminal accommodating part 12. The potting material needs to be injected from the bottom surface of the terminal accommodating part 12 to a height at which at least the terminal fitting 10 is hidden (or covered).

When the terminal box 1 is attached to the casing 3, the entire surface of the opening surface of the terminal accommodating part 12 faces the inner part of the casing 3. Accordingly, both the connection of the output conductor 8 of the solar cell module 2 to the terminal fitting 10 and the injection of the potting material can be carried out from an upper side of the casing 3. Namely, the entire of the casing 3 does not need to be turned over and the two operations of connecting the output conductor 8 and injection of the potting material can be carried out from the front side of the casing 3. Thus, a working property i.e. efficiency) is excellent.

<Other Exemplary Embodiments>

The present invention is not limited to the exemplary embodiment explained by the above-mentioned description and the drawings. For instance, below-described exemplary embodiments may be included in a technical scope of the present invention.

In the above-described exemplary embodiment, the terminal box 1 is attached to the bottom plate of the casing 3. However, the terminal box 1 may be attached to a side plate.

In the above-described exemplary embodiment, the sealing material is injected to the terminal accommodating part 12. However, the injection of the sealing material may be omitted.

In the above-described exemplary embodiment, the entire surface of one side of the terminal accommodating part 12 is open. However, the surface may only be partly opened.

In the above-described exemplary embodiment, the terminal box 1 is temporarily held to the casing by the engaging pawls 33, however, the terminal box 1 may be simply pressed into the attaching opening part 7. Further, conversely to the present exemplary embodiment, engaging pawls may be allowed to protrude in an opening edge of the attaching opening part and recessed parts (engaging parts) which are engaged with the engaging pawls may be formed in the box 9 side.

What is claimed is:

1. A solar cell module including:
a casing including a wall;
a resin box attached to the casing, the box including a terminal accommodating part;
a cable configured to connect an external part, an end part of the cable extending into the box; and
a terminal fitting, accommodated in the terminal accommodating part, the terminal fitting connected to the cable and to an output conductor, wherein
the wall of the casing has a first opening for attaching the box from an outer surface side of the casing,
the terminal accommodating part includes a second opening provided in a wall surface of the terminal accommodating part facing the wall of the casing, the second opening being directly adjacent to the wall of the casing,
the second opening faces an inner part of the casing through the first opening when the box is attached to the casing,
a portion of the terminal accommodating part, surrounding the second opening and on a peripheral edge of the second opening, protrudes into the casing through the first opening such that the portion of the terminal accommodating part extends through and beyond the first opening and into an interior of the casing,
the portion of the terminal accommodating part that extends into the interior of the casing defines an engaging member that is configured to deformingly engage a peripheral edge of the first opening, and
a positioning pin is provided on a surface of the box that faces the outer surface side of the casing.

2. A solar cell module according to claim 1, wherein
an engaging part is provided on an outer peripheral surface of the engaging member, the engaging part is configured to engage with the peripheral edge of the first opening, and
the terminal accommodating part has a tubular shape configured to fit to the first opening.

3. A solar cell module according to claim 2, further comprising a flange edge opposed to the peripheral edge of the first opening, the flange edge protruding from the terminal accommodating part along a circumferential direction at a position rearward, in a fitting direction, with respect to the engaging part, wherein
an adhesive agent is applied to the flange edge.

4. The solar cell module according to claim 1, wherein
the second opening of the terminal accommodating part being positioned opposite the first opening of the wall.

5. The solar cell module according to claim 1, wherein
the terminal accommodating part including an aperture in a wall extending transverse to the wall surface of the terminal accommodation part, the end part of the cable being configured to extend into the box through said aperture.

6. The solar cell module according to claim 1, wherein
the box includes a flange edge that protrudes from the wall surface of the terminal accommodating part, and
the positioning pin is provided on a surface of the flange edge that faces the outer surface side of the casing.

* * * * *